(12) United States Patent
Benaissa et al.

(10) Patent No.: US 9,981,420 B2
(45) Date of Patent: May 29, 2018

(54) SENSOR CAPABLE OF SENSING PRESSURE BY MEANS OF THE DEFORMATION OF A WRINKLED PIEZOELECTRIC LAYER

(71) Applicant: COMMISSARIAT A L'ENERGIE ATOMIQUE ET AUX ENERGIES ALTERNATIVES, Paris (FR)

(72) Inventors: Lamine Benaissa, Massy (FR); Jean-Sebastien Moulet, Chambery (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days. days.

(21) Appl. No.: 15/028,640

(22) PCT Filed: Oct. 16, 2014

(86) PCT No.: PCT/EP2014/072266
§ 371 (c)(1),
(2) Date: Apr. 11, 2016

(87) PCT Pub. No.: WO2015/055788
PCT Pub. Date: Apr. 23, 2015

(65) Prior Publication Data
US 2016/0252411 A1     Sep. 1, 2016

(30) Foreign Application Priority Data

Oct. 17, 2013 (FR) ..................... 13 60110

(51) Int. Cl.
*G01L 1/16* (2006.01)
*B29C 61/00* (2006.01)
(Continued)

(52) U.S. Cl.
CPC .......... *B29C 61/00* (2013.01); *B28B 17/0009* (2013.01); *B32B 3/28* (2013.01);
(Continued)

(58) Field of Classification Search
CPC ....... G01L 1/16; B29C 61/00; B28B 17/0009; B32B 3/28; B32B 3/30; B82B 3/0033; C03B 23/02; H01L 41/1132
(Continued)

(56) References Cited

U.S. PATENT DOCUMENTS 4,395,652 A * 7/1983 Nakanishi .............. G10K 11/32
                                                              310/334
5,495,137 A * 2/1996 Park ...................... B06B 1/0688
                                                              310/331

(Continued)

FOREIGN PATENT DOCUMENTS

JP    2003-134594 A     5/2003
TW    201 044 656 A    12/2010

OTHER PUBLICATIONS

U.S. Appl. No. 14/893,396, filed Nov. 23, 2015, Bruno Imbert, et al.
(Continued)

*Primary Examiner* — Harshad R Patel
*Assistant Examiner* — Octavia Hollington
(74) *Attorney, Agent, or Firm* — Oblon, McClelland, Maier & Neustadt, L.L.P.

(57) ABSTRACT

A pressure-sensitive sensor including a substrate supporting a piezoelectric layer of a piezoelectric material. The piezoelectric layer includes surface undulations as wrinkles on which pressure is exerted upon use of the sensor. The piezoelectric layer is sandwiched between two electrodes for collecting charges generated by deformation of the piezoelectric layer.

11 Claims, 9 Drawing Sheets

(51) Int. Cl.
| | |
|---|---|
| *H01L 41/113* | (2006.01) |
| *B82B 3/00* | (2006.01) |
| *B32B 3/28* | (2006.01) |
| *B32B 3/30* | (2006.01) |
| *C03B 23/02* | (2006.01) |
| *B28B 17/00* | (2006.01) |
| *H01L 21/302* | (2006.01) |
| *H01L 21/3105* | (2006.01) |
| *B29K 105/00* | (2006.01) |

(52) U.S. Cl.
CPC .............. *B32B 3/30* (2013.01); *B82B 3/0033* (2013.01); *C03B 23/02* (2013.01); *G01L 1/16* (2013.01); *H01L 41/1132* (2013.01); *B29K 2105/256* (2013.01); *B32B 2250/02* (2013.01); *B32B 2307/51* (2013.01); *H01L 21/302* (2013.01); *H01L 21/3105* (2013.01)

(58) Field of Classification Search
USPC ...................................................... 73/862.68
See application file for complete search history.

(56) References Cited

U.S. PATENT DOCUMENTS

| | | | | |
|---|---|---|---|---|
| 6,411,015 | B1* | 6/2002 | Toda | H02N 1/006 310/328 |
| 6,504,289 | B2* | 1/2003 | Toda | B06B 1/0688 310/322 |
| 6,831,985 | B2* | 12/2004 | Takei | H04R 17/00 381/190 |
| 7,499,377 | B2* | 3/2009 | Jaworski | B06B 3/02 367/157 |
| 7,900,512 | B2* | 3/2011 | Kano | G01C 19/5698 73/504.01 |
| 8,994,251 | B2* | 3/2015 | Kurachi | B41J 2/14233 310/328 |
| 2004/0056567 | A1 | 3/2004 | Menzel | |
| 2005/0194869 | A1 | 9/2005 | Menzel | |

OTHER PUBLICATIONS

U.S. Appl. No. 14/901,027, filed Dec. 27, 2015, Thomas Signamarcheix, et al.
U.S. Appl. No. 14/910,553, filed Feb. 5, 2016, Paul Gondcharton, et al.
U.S. Appl. No. 15/028,836, filed Apr. 12, 2016, Lamine Benaissa, et al.
U.S. Appl. No. 15/028,876, filed Apr. 12, 2016, Lamine Benaissa, et al.
R. Huang, "Kinetic wrinkling of an elastic film on a viscoelastic substrate," Journal of Mechanics and Physics of Solids, vol. 53, 2005, pp. 63-89.
Luka Pocivavsek, et al., "Stress and Fold Localization in Thin Elastic Membranes," Science, vol. 320, May 16, 2008, 7 pages.
G. K. Giust, et al., "New ripple patterns observed in excimer-laser irradiated SiO2/polycrystalline silicon/SiO2 structures," Applied Physics Letters, vol. 70, No. 26, Jun. 30, 1997, pp. 3552-3554.
Justin R. Serrano, et al., "Micron-scale buckling of SiO2 on Si," Journal of Applied Physics, vol. 92, No. 12, Dec. 15, 2002, pp. 7606-7610.
Y. F. Lu, et al., "Controllable laser-induced periodic structures at silicon-dioxide/silicon interface by excimer laser irradiation," XP-002726614, Journal of Applied Physics, vol. 80, No. 12, Dec. 15, 1996, pp. 7052-7056.
J. J. Yu, et al., "Laser engineered rippling interfaces for developing microtextures, adherent coatings and surface coupling," XP-002726615, Proceedings of the SPIE, vol. 3898, Dec. 1999, pp. 252-262.
G. E. Jellison, Jr. et al., "Time-resolved optical studies of oxide-encapsulated silicon during pulsed laser melting," XP-002726616, Journal of Materials Research, vol. 3, No. 3, 1988, pp. 498-505.
International Search Report dated Dec. 22, 2014 in PCT/EP2014/072266 filed Oct. 16, 2014.
Preliminary French Search Report dated Jul. 3, 2014 in FR 1360110 filed Oct. 17, 2013.

\* cited by examiner

US 9,981,420 B2

SENSOR CAPABLE OF SENSING PRESSURE BY MEANS OF THE DEFORMATION OF A WRINKLED PIEZOELECTRIC LAYER

TECHNICAL FIELD

The field of the invention is that of pressure-sensitive sensors enabling for example a contact, a pressure or even a sliding movement to be detected. Such sensors find application in particular in the field of robotics where they may equip robot gripping tools in order to monitor the behaviour of objects.

STATE OF PRIOR ART

Pressure-sensitive sensors, known as POSFET (Piezoelectric Oxide Semiconductor Field Effect Transistor), operate with the same principle as a field effect transistor. A piezoelectric layer, most often of a polymer, typically PVDF (polyvinylidene fluoride), covers the gate region of a MOS transistor. The internal field of the piezoelectric layer varies with the pressure applied thereto, which comes to modify the operation of the transistor.

DISCLOSURE OF THE INVENTION

One purpose of the invention is to improve the sensitivity of pressure sensors making use of the deformation of piezoelectric materials. To that end, it provides a pressure-sensitive sensor comprising a substrate supporting a piezoelectric layer of a piezoelectric material, characterized in that the piezoelectric layer has surface undulations as wrinkles on which the pressure is exerted upon use of the sensor.

Some preferred but in no way limiting aspects of this sensor are the following ones:
- the substrate is covered with a layer forming a lower electrode;
- the piezoelectric layer is formed on the lower electrode;
- the piezoelectric layer is an undulated layer suspended above the substrate outside zones of localized adherent contact with the lower electrode;
- it further comprises a lower intermediate layer interposed between the lower electrode and the piezoelectric layer, the lower intermediate layer having surface undulations identical to those of the piezoelectric layer;
- the substrate is covered with a lower intermediate layer having surface undulations identical to those of the piezoelectric layer;
- it comprises a layer forming a lower electrode interposed between the lower intermediate layer and the piezoelectric layer;
- it comprises a lower electrode as an undulated layer suspended above the substrate outside zones of localized adherent contact with the substrate;
- the substrate has surface undulations identical to those of the piezoelectric layer;
- it comprises an upper electrode conformally formed at the surface of the piezoelectric layer;
- it comprises an upper electrode and an upper intermediate layer between the upper electrode and the piezoelectric layer;
- the upper electrode comprises a plurality of regions spatially separated from each other;
- the wrinkles of the piezoelectric layer are rectilinearly oriented;
- the wrinkles of the piezoelectric layer are oriented so as to form a series of concentric rings.

BRIEF DESCRIPTION OF THE DRAWINGS

Further aspects, purposes, advantages and characteristics of the invention will better appear upon reading the following detailed description of preferred embodiments thereof, given by way of non-limiting example, and made in reference to the appended drawings in which.

DETAILED DISCLOSURE OF PARTICULAR EMBODIMENTS

The invention is concerned with a pressure-sensitive sensor using the deformation of a piezoelectric layer. The sensor comprises a substrate supporting a piezoelectric layer of a piezoelectric material. The piezoelectric layer has surface undulations as wrinkles on which the pressure is exerted upon use of the sensor. The deformability of such a wrinkled layer is higher than that of a planar layer. As a result, there is a greater sensitivity to pressure. Having a wrinkled layer in the form of fingerprints, and not as a planar layer, further allows detection of a sliding movement and depending on the case, of the orientation of this sliding.

The piezoelectric layer consists of a material having piezoelectric properties. It can consist of a solid material which is deposited or transferred, or of a polymeric material. Among the materials that can be mentioned by way of examples, there are solid materials such as AlN, PZT, ZnO, LiNbO3, LiTaO3, KNbO3, and polymers such as PVDF and PVDF-TrFE, quartz, SrTiO3, BaTiO3, langasites.

The sensor includes in addition to the piezoelectric layer in a wrinkled form at least one electrode of a conducting material on either side of the piezoelectric material, for example so as to form an electrode-piezoelectric layer-electrode sandwich. This arrangement provides for the collection of the charges generated by the piezoelectric effect during the deformation of the piezoelectric layer.

The electrode-piezoelectric material-electrode stack is supported by the substrate to enable the handling thereof. The substrate can consist of different solid and/or polymeric layers. The sensor can further comprise intermediate additional layers at the different stages of the stack, for example to facilitate the manufacture, insulation thereof, etc.

The surface undulations of the piezoelectric layer are obtained by means of a technique based on thermodynamic self-organization processes.

Figure 1A:
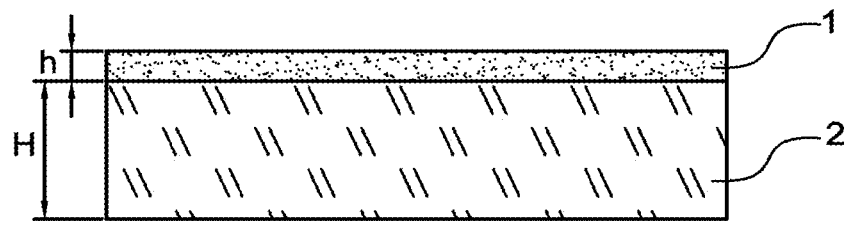
FIGS. 1a, 1b and 1c illustrate a surface structuring method that can be used to form wrinkles within the scope of the manufacture of the sensor according to the invention.
Figure 1B:
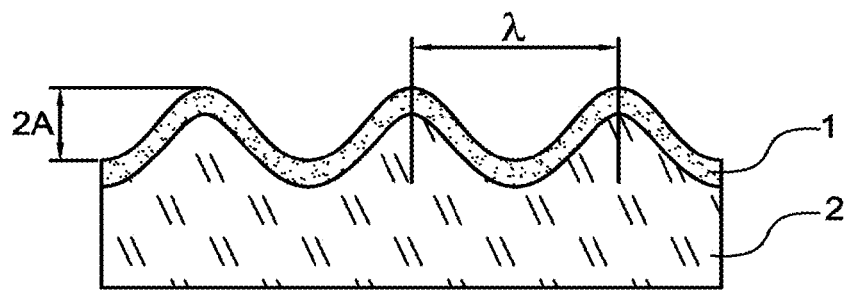
Figure 1C:
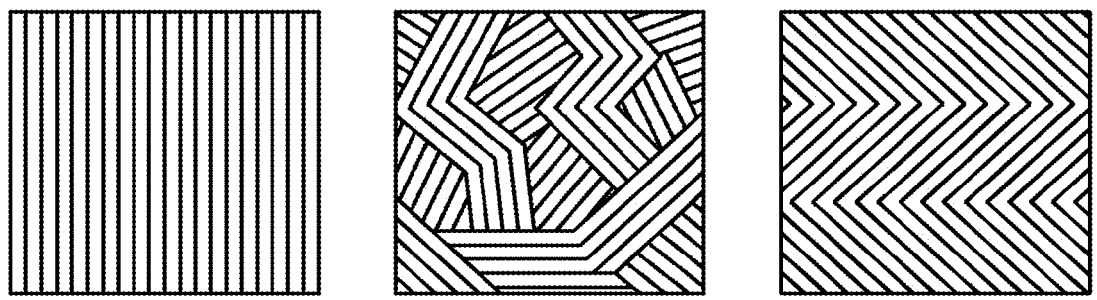

This technique, illustrated in FIGS. 1a-1c, relies on the deformation of an elastic thin layer 1 with a thickness h attached to a thicker support 2, with a thickness H. The elastic thin layer 1 is designated in the following by the term skin, and the support 2 by the term foundation. This deformation has as its driven force a strain which relative to the elastic layer corresponds to a compressive strain of the foundation on the layer. This stress introduces an instability of the elastic layer/foundation system and results in the formation of wrinkles characterized, as represented in FIG. 1b, by their wavelength λ and their amplitude A (corresponding to half peak-to-peak height 2A). As represented in FIG. 1c, the wrinkles are also characterized by their orientation O that can have the form of strips (on the left), labyrinths (in the centre) or chevrons (on the right).

The theory of wrinkles describes two modes according to which the elastic layer/foundation system will manage this instability.

When both the thin layer 1 and the foundation 2 are elastic, the system spontaneously changes to minimize its energy. Within this context, the emergence of wrinkles of a given wavelength corresponds to a trade-off between the flexural energy of the system and the energy required to deform the surface of the foundation. The formation of the wrinkles is in the first order dictated by the elastic module ratio between the skin and the foundation, their thickness ratio and the intensity of the stress to be relaxed by the system. The lower the foundation stiffness, the lower is the critical stress required for forming the wrinkles.

In practice, materials with exceptional properties (elastic properties and low stiffness) are required such as elastomers to observe wrinkles. A strongly strained thin layer on a rigid foundation will actually tend to produce a deflection rather than wrinkles.

On the other hand, it is to be noted that once the wrinkles are formed, the system is in equilibrium. The removal of the thin layer then causes a spontaneous return of the elastic foundation to its initial state, that is without wrinkles.

When the foundation is viscous, the formation of wrinkles is caused for much lower stresses and the system energy is namely dissipated by viscous flow of the foundation. Unlike the elastic/elastic system, the amplitude of the wrinkles is in this case subjected to a kinetics which is governed by the relaxation module of the viscous foundation. Hence, the amplitude of the wrinkles is restricted, and in practice incompatible with the intended applications.

In practice, the understanding of the elastic/viscous system enabled strategies for removing low amplitude wrinkles to be developed. For example, by transferring strained films on ad hoc foundations, it is possible to reverse the wrinkle formation process. This makes it possible for example for single crystal films to allow a relaxation by lateral expansion rather than by the formation of dislocations.

There is for this second mode a particular case which corresponds to the limit condition of a liquid foundation. A strained thin film deposited on a liquid indeed systematically forms wrinkles at the surface in view of the low relaxation module of the liquid. The handling of such a system (thin layer on liquid) is however sensitive, which nowadays restricts applications to laboratory studies and/or characterization of thin films.

For these different relaxation modes, there are analytical or semi-analytical solutions which enable the wavelength and the amplitude of the wrinkles formed to be accurately described. As regards orientation, numerous studies report that in-plane stress ruptures are the origin of favoured orientations. Thus, creating a low-relief or even defining patterns enables the wrinkles along the in-plane stress field distribution to be accurately oriented.

In the light of the above, the surface structuring methods by formation of wrinkles are today mainly restricted to some types of polymers, whereas for other materials, the low amplitude of the wrinkles obtained (typically in the order of 10 nm, namely lower than 20 nm peak-to-peak) remains incompatible with the intended applications or complex to implement for a large scale production.

Thus, in the first mode of manufacture of the sensor according to the invention, polymers are used to obtain wrinkles. Different techniques have been developed during the last twenty years. There can be mentioned in particular techniques implementing an annealing of the polymer followed by a deposition of the thin layer, those implementing stretching the polymer followed by depositing the thin layer, those relying on osmotic methods, on UV or plasma treatments, etc. This manufacturing mode will be designated by the term "polymer manufacture" in the following.

The polymeric layer can be located at different stages of the stack. It can form an electrode (use of a conducting polymer) and/or the piezoelectric layer (use of a piezoelectric polymer such as PVDF). The sensor can have several polymeric layers, and the substrate itself can be of a polymeric material. The polymer can also be an intermediate layer located in the stack, above the substrate. Different exemplary embodiments will be introduced in the following in connection with FIGS. 8-10 and 13.

A second mode of manufacturing of the sensor according to the invention does not use polymers to obtain wrinkles but follows the surface structuring method set out in FIGS. 2a-2d and 4a-4c and which implements one or several melting/solidification cycles of the foundation. This manufacturing mode will be designated by "solid manufacture" in the following. A first embodiment for wrinkles will be described herein using an oxide/silicon/oxide stack, the wrinkled stack obtained being possibly used to make a stack comprising a piezoelectric layer sandwiched between two electrodes. Alternatively, the method described in connection with this oxide/silicon/oxide stack can be adapted to obtain wrinkles directly on a stack including one or more electrodes and/or a piezoelectric layer.

Figure 2A:
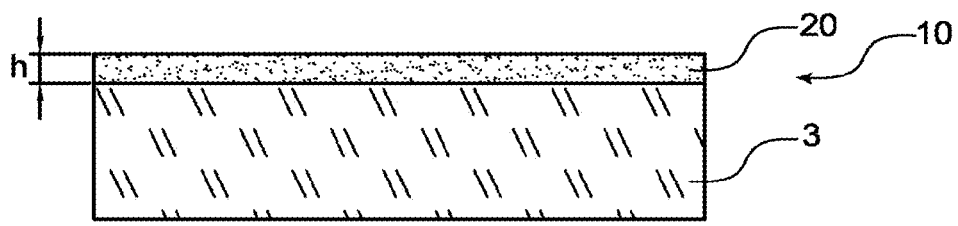
FIGS. 2a-2d illustrate a first possible embodiment of the surface structuring method that can be used within the scope of the invention.
Figure 4A:
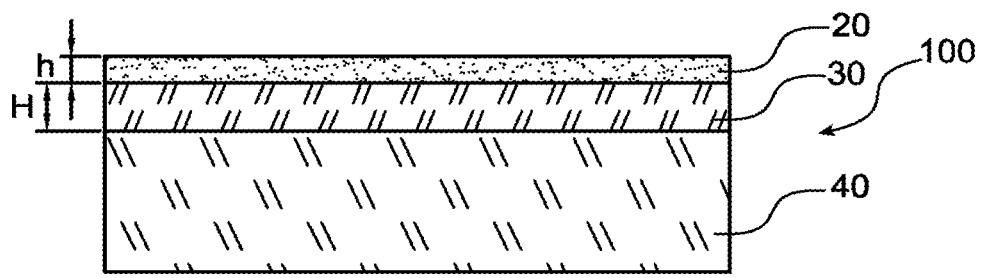
FIGS. 4a-4c illustrate a second possible embodiment of the surface structuring method that can be used within the scope of the invention.

Referring to FIGS. 2a and 4a, this method aims at structuring the surface of a bilayer structure 10, 100 initially comprising a strained layer 20 on a solid state foundation 3, 30. The stressed layer 20 is more particularly an elastic layer with a thickness h whereas the foundation can take the form of a substrate 3 as represented in FIG. 2a, or a layer 30 with a thickness H formed at the surface of a rigid substrate 40 as represented in FIG. 4a.

The strained elastic thin layer 20 has more particularly a tensile stress in at least one direction of the plane of the thin layer, or even a compressive stress only in one direction of the plane.

The elastic thin layer 20 can be formed by implementing a deposition onto the foundation 3, 30, or even be formed by implementing a chemical reaction at the surface of the foundation (for example oxidation, nitration, carburation, etc.). The strain of the elastic thin layer is in particular related to a lattice parameter mismatch of the materials making up the foundation and the thin layer, and can be adjusted by varying the formation conditions of the thin layer, for example via the temperature of the deposition which generates a more or less high heat stress depending on the difference of the heat expansion coefficients of the thin layer and of the foundation.

Figure 2B:
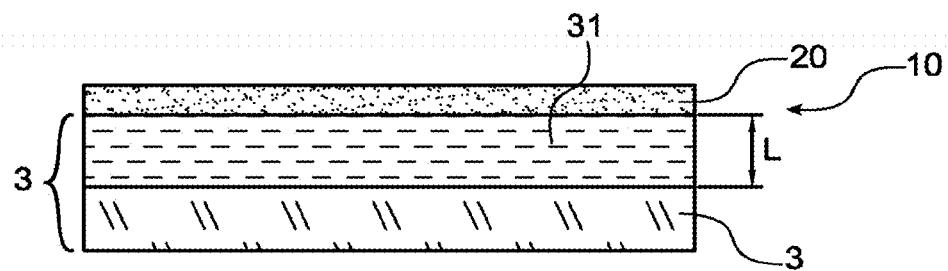
Figure 4B:
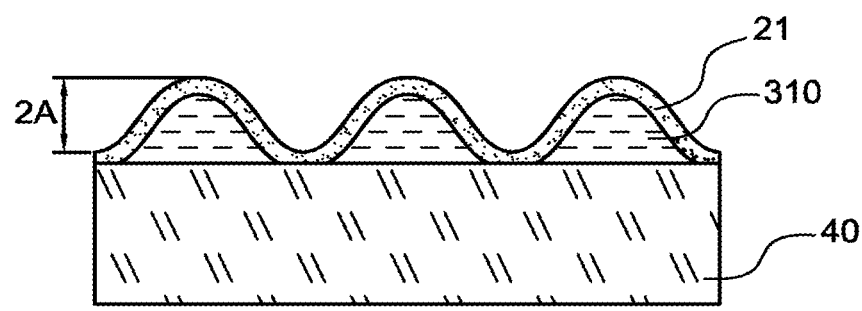

Referring to FIGS. 2b and 4b, this surface structuring method comprises a step of melting at least part of the foundation to bring it to the liquid state, said part being at least in contact with the stressed elastic layer.

Said at least part of the foundation brought to the liquid state has a thickness L, and can correspond in a first embodiment to an upper layer 30 of a foundation as a substrate 3 in contact with the elastic thin layer (FIG. 2b) or even in a second embodiment to all or part of a foundation as a layer 30 with a thickness H at the surface of a rigid substrate 40 (FIG. 4b).

Figure 2C:
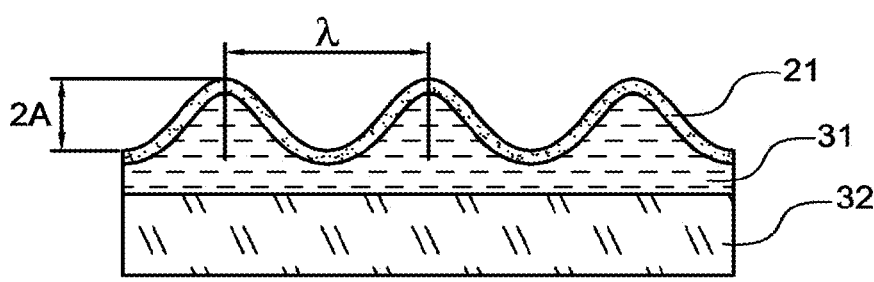

As illustrated in FIGS. 2c and 4b, said at least part now being liquid 31, 310 mechanically decouples the strained elastic thin layer 20 from a solid part consisting of the non-molten solid part 32, of the foundation substrate 3, or even consisting of the rigid substrate 40 under the layer-foundation 30. For the melting time, the bilayer structure 10, 100 is positioned in the limit condition corresponding to an elastic thin layer/viscous foundation theoretical relaxation with an infinite relaxation time. The stress relaxation of the elastic layer generates a simultaneous deformation of the elastic layer and of said at least liquid part of the foundation. The liquid nature allows and promotes wrinkle formation rather than flexural deformation. To obtain a structuration with an amplitude higher than 30 nm, it is required that the thickness L made liquid is higher than or equal to 20 nm, advantageously higher than or equal to 30 nm, and that the time for which this layer is liquid is at least 50 ns to allow for a maximum relaxation of the thin layer 20. The higher the thickness L of the foundation made liquid, the more the amplitude of the intended wrinkles can grow. However, there is a maximum value Lmax of the thickness made liquid beyond which the amplitude of the wrinkles cannot grow any longer, this maximum amplitude being dictated by the theory of wrinkles in the homogeneous linear growth regime of the amplitude. By way of illustrating example, for an intended wrinkle amplitude higher than 75 nm, a thickness L typically in the order of 50 to 100 nm is chosen.

Figure 2D:
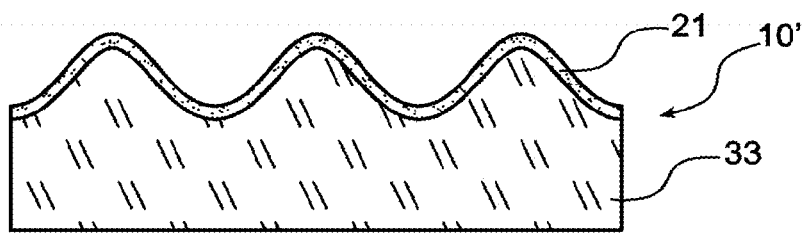
Figure 4C:
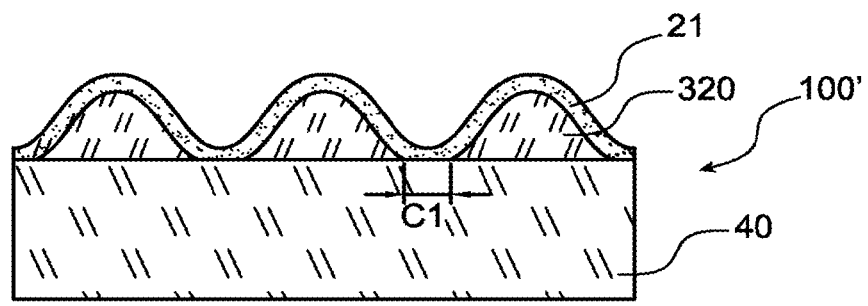

As illustrated in FIGS. 2d and 4c, this surface structuring method then comprises solidifying said at least part 21, 310 of the foundation to bring it back to the solid state, said solidification forming a solid structure 10', 100' having wrinkles at the surface. This return to the initial conditions (solid state of the foundation) enables the wrinkles formed to be fixed.

The thin elastic layer, which is found wrinkled once the return to the initial conditions is made, can be an electrode, the piezoelectric layer or even an intermediate layer such as a SiO2 layer for example. Different exemplary embodiments are presented in the following in connection with FIGS. 8 to 14.

The melting step can be more particularly made by selectively feeding energy such that the energy is mainly absorbed by said at least part of the foundation with the thickness L rather than the strained elastic layer and than the underlying rigid substrate 40 if appropriate, for example with a ratio of at least 100/1, preferably with a ratio of at least 1000/1.

The thin layer preferably has a melting temperature higher than the melting temperature of the foundation. Likewise, the rigid substrate 40 supporting in the second embodiment a layer-foundation 30 has also preferably a melting temperature higher than the melting temperature of the foundation. Alternatively, or in addition, a thermally insulating intermediate layer can be inserted between the layer-foundation 30 and the rigid substrate 40 so as to insulate the rigid substrate 30 from thermal phenomena. Once again, the thermally insulating intermediate layer preferably has a melting temperature higher than the melting temperature of the foundation.

The foundation can have a combination of two or more materials, so as to reduce the melting temperature thereof or even to improve the energy supply absorption thereof. By way of illustrating example, a silicon doping enables the melting temperature thereof to be lowered.

The thin layer can also have a combination of two or more materials. The combination of materials can have equivalent average physical properties (Young modulus, Poisson, and stress) enabling the intended structure to be adjusted at best according to the theory of wrinkles and/or can have an average behaviour relative to the energy source such that the energy absorption ratio is at least 1/100 ideally 1/1000 relative to the foundation.

The duration of the melting step is typically between 50 ns and 1 s, advantageously between 50 ns and 1 ms. Short durations are favoured to avoid a temperature rise in the entire foundation and to alter too much the mechanical properties of the thin layer. For equivalent configurations, the thickness of the foundation made liquid and the duration in the liquid state are the two main parameters enabling the amplitude of the wrinkles to be adjusted.

The duration of the cooling step is also advantageously controlled to remain lower than 1 s, advantageously lower than 1ns, in order to preserve the wrinkles during cooling. This duration can in particular be adapted to the intended period of the wrinkles. Indeed, the higher the cooling duration, the higher is the wavelength of the wrinkles. The cooling can thus be slowed down, for example by one or more energy supplies during this period, as a function of the intended period.

According to the nature of the materials concerned, the melting can be achieved by employing a laser energy source at a chosen wavelength to ensure a selectivity of the energy supply depending on the thickness and absorption of the materials in question, or even by employing an induction magnetic source or a microwave source. By way of illustrating example, a laser source can be used emitting in the ultra-violet, for example at a wavelength of about 300 nm, when the thin layer, for example of $SiO_2$, is transparent to ultra-violets and the foundation rather absorbs this light, for example when it is made up of silicon.

When the foundation is electrically conducting (this is the case in particular when it is metallic, for example of copper) and inserted between electrically insulating materials (thin layer on one side, intermediate layer and/or rigid substrate 40 on the other side), the melting of said at least part of the foundation can be made by a thermal energy supply making use of the joule effect. When the foundation is inserted between electrically conducting materials (thin layer on one side, intermediate layer and/or rigid substrate 40 on the other side) and has a resistivity higher than that of said electrically conducting materials, the melting of said at least part of the foundation can be made by a thermal energy supply making use of a resistive heating.

The amount of energy required for melting all or part of the foundation can be predetermined by detecting the phase change of all or part of the foundation of a standard structure, for example by means of a reflectivity, resistivity, density, etc. measurement.

The wrinkles created are characterized by their wavelength λ, their amplitude A and their orientation O according to the theory of wrinkles, and are mainly related to the physical parameters of the thin layer and of the foundation in its liquid phase.

A thin layer of $SiO_2$ (skin) with a thickness h of 50 nm and a tensile stress of 200 MPa is considered by way of illustrating example. The foundation is of amorphous Si and molten on a thickness L of 150 nm in contact with the thin layer.

The calculations given here are within the scope of the theory of wrinkles elastic film on a viscous foundation/liquid. The foundation is made liquid by melting from its solid phase using a focused energy supply, typically a laser one (UV 308 nm, 150 ns pulse, 0.8 J·cm-2 energy). The silicon foundation absorbs most of the energy supply provided, the $SiO_2$ skin remains transparent to the working wavelength.

| Thin layer | | |
|---|---|---|
| Young modulus | Ep | 80 GPa |
| Poisson | Np | 0.17 |
| Initial stress | Cp | 200 MPa |
| Liquid foundation | | |
| Young modulus | Ef | 120 GPa |
| Relaxation module | µf | 50 MPa |
| Poisson | Np | 0.22 |

Period of the Wrinkles

When the thermodynamic conditions are compatible with the formation of wrinkles, the most favourable oscillation period to the system is instantaneously reached. Within the scope of this surface structuring method, the period is then set upon cooling, during which it is considered that the foundation is in a viscous state. The period of the wrinkles λ is defined by the formula below, from the publication by R. Huang entitled "Kinetic wrinkling of an elastic film on a viscoelastic substrate", Journal of Mechanics and Physics of Solids, 2004

$$\lambda = 2\pi h \left[ \frac{(1-\upsilon_f)}{6(1-\upsilon_p^2)} \frac{E_p}{\mu_f} \right]^{1/3}.$$

The instantaneous character of the setting up of the period implies that this will change over time if the parameters defining it change over time, in particular µf, viscous relaxation module of the foundation. µf is defined by the following formula:

$$\mu_f = E_f/2(1+\nu_f).$$

In the dynamic system investigated, where the foundation switches from its solid phase to its liquid phase and then to its solid phase again, the foundation has its relaxation module dramatically changed. According to Huang 2004, it can be estimated that µf varies over more than five orders of magnitude, that is $50.10^9$ Pa for its liquid phase to a few $50.10^4$ Pa for its viscous/liquid phase. The period λ consequently changes over time to be fixed during the return to the solid phase of the foundation about a value corresponding to an "average value" of µf estimated to $50.10^6$ Pa. Thus, in this case, the calculated oscillation period is λ=1.879 µm which corresponds to what is observed.

Amplitude of the Wrinkles

The growth of the amplitude of the wrinkles is a kinetic phenomenon. It is all the more quick as the foundation is in its liquid state. Thus, in the example investigated where the melting time is in the order of 500 ns, the amplitude of the oscillations can reach its maximum value described in the case of an elastic skin/liquid foundation system.

The following formula can then be used, according to the publication by Cerda & Pociavesk, Science, "Stress and Fold Localization in Thin Elastic Membranes", 2008:

$$= \frac{\sqrt{2}}{\pi} \lambda \sqrt{\frac{\Delta}{W'}} \text{ with } \Delta = \frac{|\sigma_p| \cdot W}{E_p}$$

representing the skin contraction distance.

When calculating the distance A, the Young modulus of the skin intervenes. Although this is a case where the energy application is quick (150 ns pulse) and the entire method lasts less than 1 µs, it is reasonable to consider here that when the foundation is liquid, the estimated Young modulus of the skin is lowered by one order of magnitude, from $80.10^9$ Pa to $8.10^9$ Pa. An amplitude A of 134 nm is then calculated, that is a peak-to-peak height of 268 nm.

Figure 3:
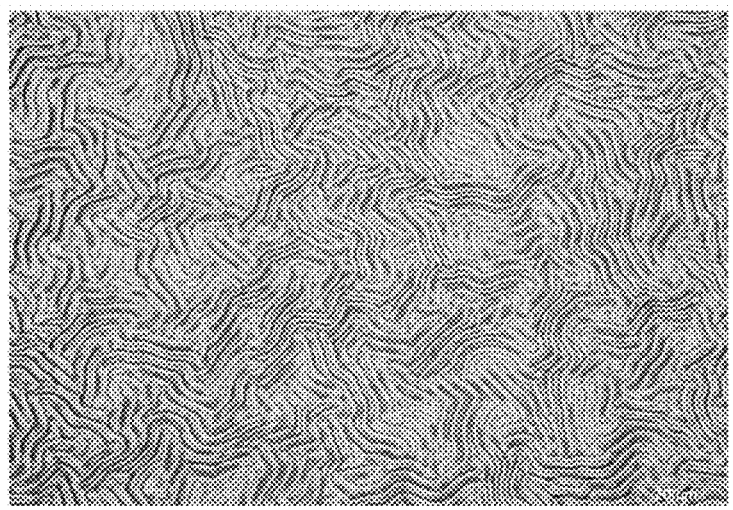
FIG. 3 represents wrinkles formed at the surface of a substrate.

In this regard, FIG. 3 illustrates the formation of wrinkles with a wavelength of about 2 µm and a peak-to-peak amplitude of 268 nm.

This peak-to-peak amplitude thus corresponds to a theoretical peak-to-peak amplitude of the wrinkles which may be predetermined, and be used to define the thickness L of the foundation intended to be molten in its liquid phase.

Thus, in the first embodiment where the foundation takes the form of a substrate 3, when the molten thickness L is lower than a predetermined thickness corresponding to the theoretical peak-to-peak amplitude of the wrinkles, the wrinkles formed thus have a peak-to-peak amplitude lower than the theoretical peak-to-peak amplitude. The control of the molten thickness can thus enable the amplitude of the wrinkles formed to be controlled.

In the second embodiment where the foundation takes the form of a layer 30 lying on a substrate 40, when the molten thickness L is lower than the predetermined thickness corresponding to the theoretical peak-to-peak amplitude of the wrinkles, the formation of the wrinkles is accompanied as represented in FIGS. 4b and 4c by a localized contact between the thin layer 21 and the rigid substrate 40 separating regions of the foundation 320 between zones of localized contact between the thin layer 21 and the substrate 40. When the theory predicts a theoretical peak-to-peak amplitude of about 268 nm, from a thin layer of $SiO_2$ with a thickness of 50 nm and a tensile initial stress of about 200 MPa and a layer-foundation of 150 nm thickness, a peak-to-peak amplitude limited to 230 nm was observed.

This contact can be transformed in adherence when the surfaces of the thin layer and of the substrate are smooth, for example with a surface roughness lower than 5 nm RMS, or even by making a further thermal energy supply for enhancing the adherence, or even via reiterating the melting step.

In one exemplary application, the insulated regions of the foundation 30 can further be used as an etching hard mask when the foundation 30 and the substrate 40 have a selectivity relative to a chemical etching.

It is also possible, at the end of a melting/solidification cycle, to remove the foundation brought back to the solid state to suspend the elastic layer 21 above the substrate outside the zones of localized adherent contact C1.

The material(s) making up the substrate 40, the foundation 30 and the elastic layer 20 can in particular be selected such that the foundation 30 has with respect to the thin layer 20 and to the substrate 40 a strong selectivity to an etching, typically a selectivity higher than 1000/1. The removal of the foundation is then made by etching the solid material 320 of the foundation lying under the thin layer 21 to form a structure consisting of the substrate 40 and the thin layer suspended above the substrate outside the zones of localized adherent contact.

It will be noticed that the method can comprise before removing the foundation, removing the elastic layer (for example a selective etching towards the foundation and the substrate) and then depositing a new layer onto the foundation and the substrate. This new layer can also take the form of an undulated layer in accordance with the wrinkles and in localized contact with the substrate. This new undulated layer will form the locally suspended layer after removing the foundation.

Alternatively, one or more layers can be deposited onto the undulated layer, before or after removing the foundation, and in particular the layers forming the electrodes as well as the piezoelectric layer.

Generally, the undulated layer (thin layer, or new deposited layer) can be a multi-layer structure, for example a structure comprising a layer of piezoelectric material sandwiched between two metal layers. And after removing the foundation, the undulated layer locally lying on the substrate can be covered with one or more layers, for example packaging ones.

Orientation of the Wrinkles

Figure 5A:
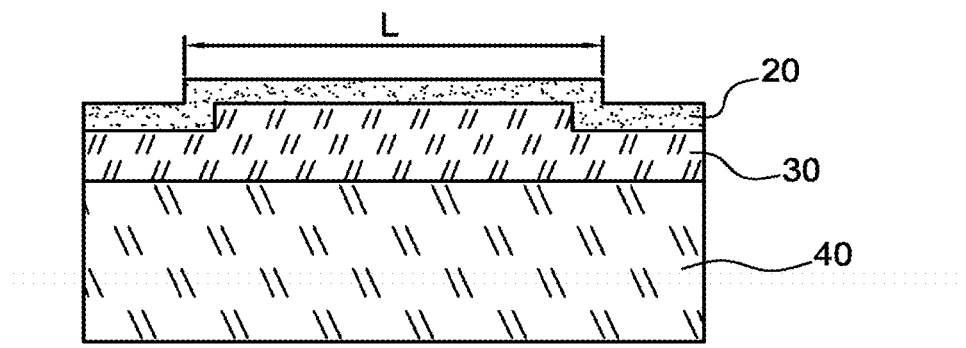
FIGS. 5a-5b illustrate the creation of a low-relief for orienting the wrinkles formed at the surface of a substrate.
Figure 5B:
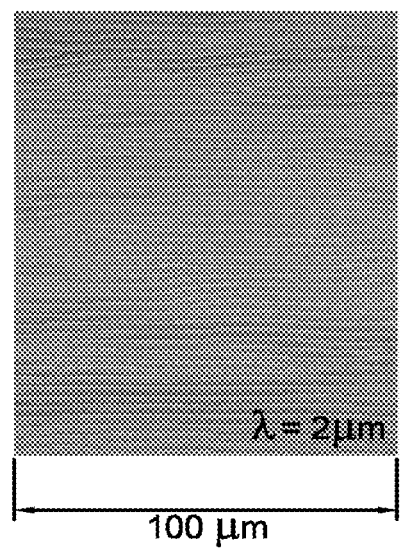

As regards the orientation O of the wrinkles, a favoured orientation of structuration can be defined by having an elastic layer the stress of which initially has a discontinuity in the plane of the layer, preferably stress discontinuities in a single direction of the plane spaced apart by a length lower than 2000 times the thickness h of the layer. In FIG. 5a, a low-relief is represented introducing such stress discontinuities, here spaced apart by 100 µm, with a layer-foundation 30 having a thickness of 150 nm at a low-relief and of 70 nm elsewhere. FIG. 5b illustrates the formation of wrinkles oriented in quasi-parallel from a stressed thin layer 20 of $SiO_2$ with a thickness of 50 nm and having an initial tensile stress of 100 MPa, of a layer-foundation 30 of Si having the low-relief of FIG. 5a and lying on a substrate 40 of Si including at the surface a thermally insulating intermediate layer of $SiO_2$.

In one embodiment, the method can comprise an initial step of creating patterns at the surface of the electric layer and/or the foundation to induce said stress discontinuity. This creation of patterns is for example made by means of a laser line.

In a possible embodiment, the thin layer and the foundation are chosen so as to have a selectivity relative to etching, for example dry wet etching, which enables removal of the skin or of the foundation to be made. Insofar as, at the end of the solidification step, the structure formed 10', 100' remains fixed, such a removal does not result in the disappearance of the surface structuration wrinkled.

In one exemplary application, when the foundation takes the form of a layer 30 lying on a rigid substrate 40, the foundation and the substrate can be chosen so as to have a low selectivity, preferably a zero selectivity, relative to etching, for example a dry wet etching. In such a manner, after a possible removal of the thin layer when it neither has a low selectivity relative to the etching retained, the surface structuration is transferred from the foundation to the substrate.

An alternative embodiment where the foundation takes the form of a layer 30 lying on a substrate 40, and applicable when the molten thickness L is lower than the predetermined thickness corresponding to the theoretical peak-to-peak amplitude of the wrinkles, is detailed hereinafter in reference to FIGS. 6a-6e.

Figure 6A:
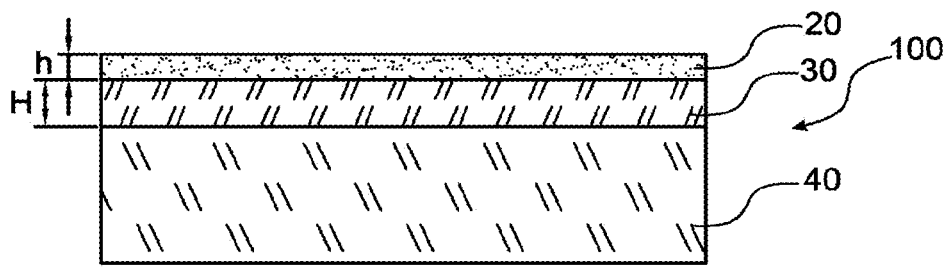
FIGS. 6a-6e illustrate an alternative to the second possible embodiment of the surface structuring method that can be used within the scope of the invention.
Figure 6B:
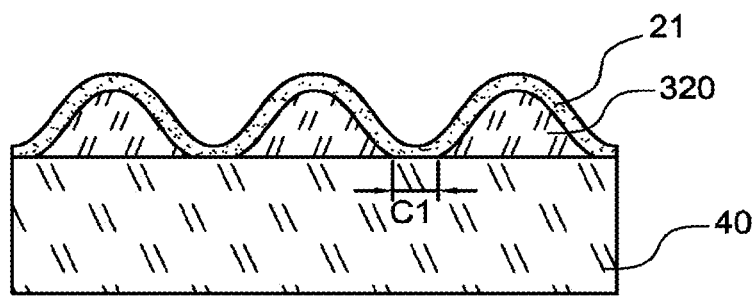

FIG. 6a represents the initial structure 100 consisting of the substrate 40, the foundation 30 and the strained elastic thin layer 20. FIG. 6b represents the structure obtained following the melting and solidification steps described above to result in the formation of fixed wrinkles and a localized adherent contact of the wrinkled thin layer 21 with the substrate 40 separating regions of the wrinkled solid foundation. A zone of thin layer/substrate adherent contact forms an interval separating two adjacent regions of the foundation which extends on a distance C1.

Figure 6C:
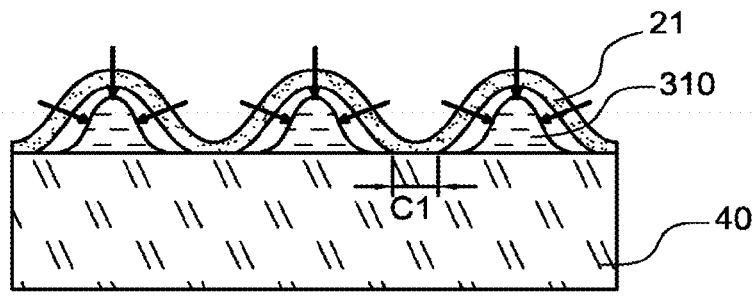
Figure 6D:
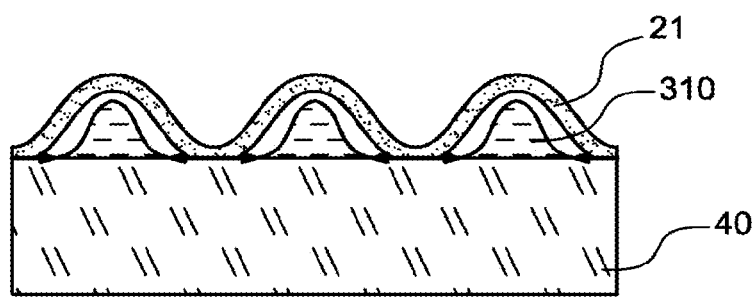
Figure 6E:
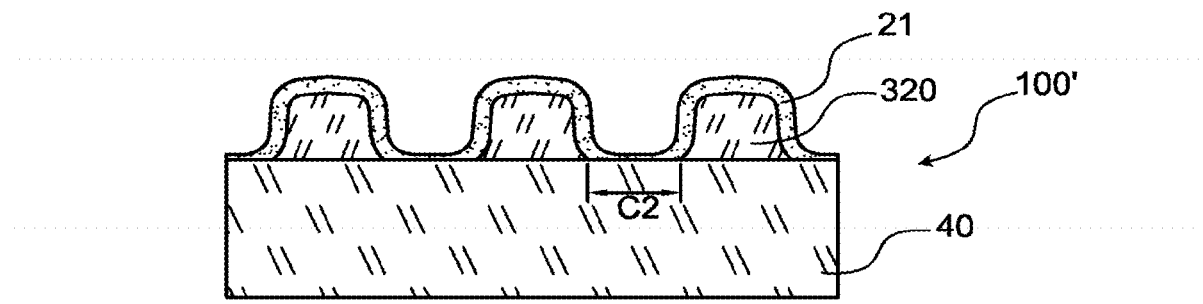

Within the scope of this alternative, the melting and solidification steps are reiterated. By taking the example of a foundation of a material which has the property to be contracted in volume upon switching from its solid state to its liquid state (as is the case for example of the following materials: Si, Ga, Ge, Pu, Sb, $\alpha$-$ZrW_2O_8$, $C_2N_2Zn$, $H_2O$), the melting and solidification steps are reiterated within the scope of this alternative such that the smaller volume in the liquid phase of the foundation 310, illustrated in FIG. 6c, is accompanied by a contact of the thin layer 21 with the substrate 40 on a higher distance which promotes adhesion as represented in FIG. 6d. As a result, after solidification, there is the structure 110' represented in FIG. 6e for which the interval C2 between the separated regions of the foundation is enhanced and the amplitude of the wrinkles is increased.

Figure 7:
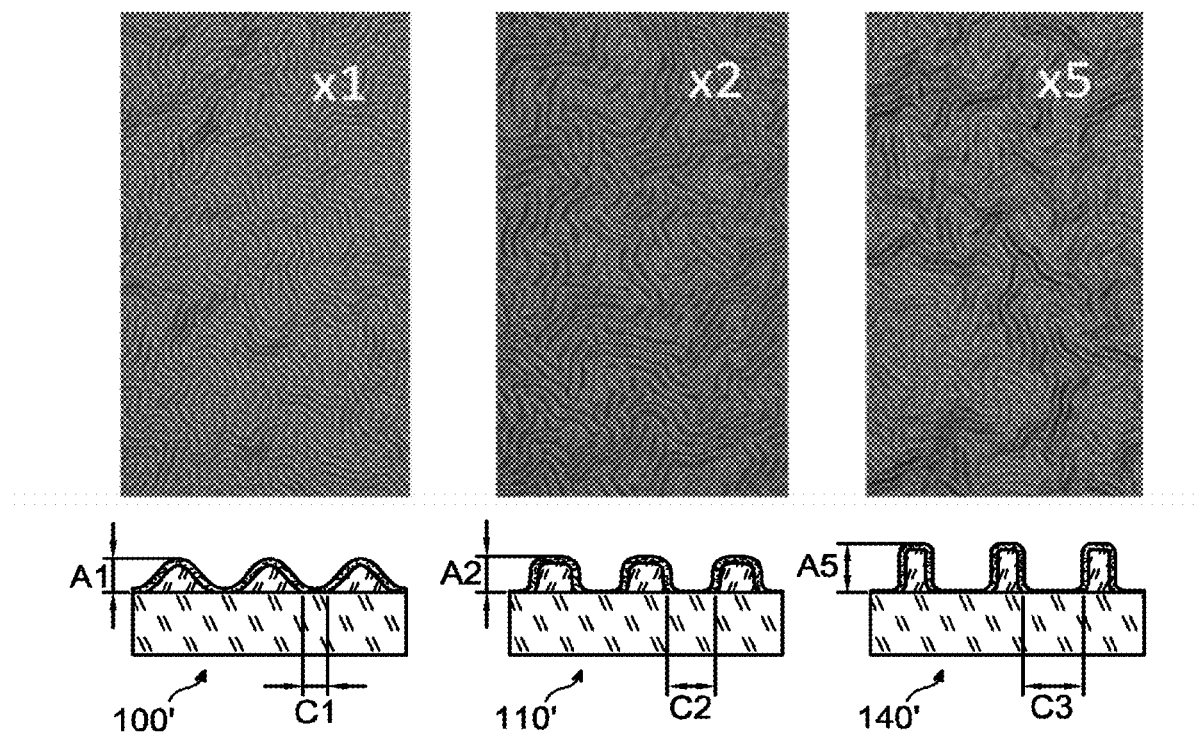
FIG. 7 represents wrinkles formed at the surface of a substrate within the scope of the alternative illustrated in FIGS. 6a-6e.

As represented in FIG. 7, it is possible to reiterate several times the melting and solidification steps, as long as the thin layer resists to deformation. Adherence works of the thin layer and the substrate thin the separated regions of the foundation in the structures 100', 110', 140' formed (after respectively 1, 2 and 5 melting/solidification sequences from left to right in FIG. 7) which have their amplitude A1, A2, A5 gradually increased whereas the interval C1, C2, C5 separating the isolated regions increases. The separated regions have the advantage to be smooth because they come from a liquid phase and thus have less defects in comparison with lithographic methods followed by etching.

Within the scope of this alternative of the invention, it is ensured that the number of reiterations of the melting and solidification steps are restricted for the thin layer to resist to deformation stresses. And the removal of the foundation can be made following several reiterations of the melting and solidification steps.

Since the skin deformation has a limit, during a volume contraction obtained during a reiteration of the melting step, the liquid is found even more confined and the return to the solid state results in a too high rise in pressure. This causes the rupture of the thin layer in the zone where the stress is maximum, that is at the maximum amplitude of the wrinkles. This rupture is accompanied by an eruption of the melting liquid from the foundation. This liquid can flow out along the skin. If the conditions are met, and in particular if the melting material has a low wettability relative to the skin surface material (typically corresponding to a drop angle higher than 80°), a nanoscale ball of material can be formed on top of the crater.

Different exemplary embodiments of a sensor according to the invention are presented hereinafter in the following in connection with FIGS. 8 to 14.

As represented in FIGS. 8-11 and 14, the substrate 1 can be covered with a lower electrode layer 3a.

Figure 8:
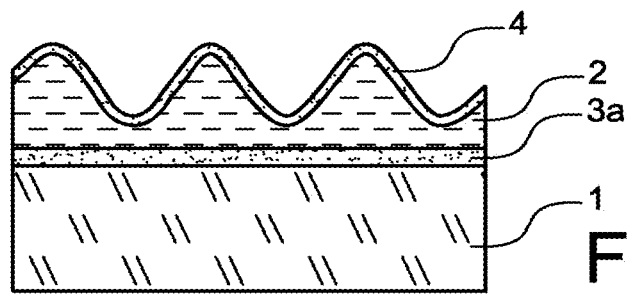
FIGS. 8 to 14 are schemes illustrating different alternative embodiments of the sensor according to the invention.

The piezoelectric layer 2 can be directly formed on the lower electrode 3a as represented in FIG. 8.

Within the scope of a "polymer manufacture", the sensor of FIG. 8 can be made by means of a polymeric piezoelectric layer as a foundation, and a metal layer as a skin, this metal layer being intended to act as an upper electrode 4 of the sensor.

Figure 9:
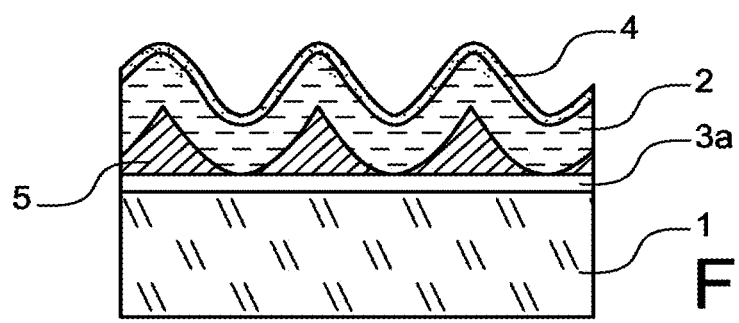

As represented in FIG. 9, the sensor can further comprise a lower intermediate layer 4 interposed between the lower electrode 3a and the piezoelectric layer 2, the lower intermediate layer 5 having surface undulations identical to those of the piezoelectric layer.

Within the scope of the "polymer manufacture", the sensor of FIG. 9 can be made by means of a polymeric layer forming the lower intermediate layer 5 as a foundation, and the piezoelectric layer 2 as a skin. The piezoelectric layer 2 is then covered with a metal layer that will act as an upper electrode 4. The skin can also form a bilayer associating the piezoelectric layer 2 with the metal layer forming the upper electrode 4.

Within the scope of a "solid manufacture", the sensor of FIG. 8 can be made by means of the lower intermediate layer 5 as a foundation, and the piezoelectric layer 2 as a skin. The piezoelectric layer 2 is then covered with a metal layer that will act as an upper electrode 4. The skin can also form a bilayer associating the piezoelectric layer 2 with the metal layer forming the upper electrode 4. In one alternative, the skin can be removed after forming wrinkles at the surface of the lower intermediate layer 5, before making a conformal deposition of the stack consisting of the piezoelectric layer 2 and the metal layer forming the upper electrode 4.

Figure 11:
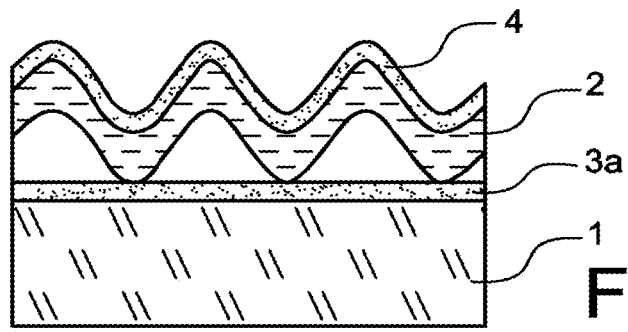
Figure 14:
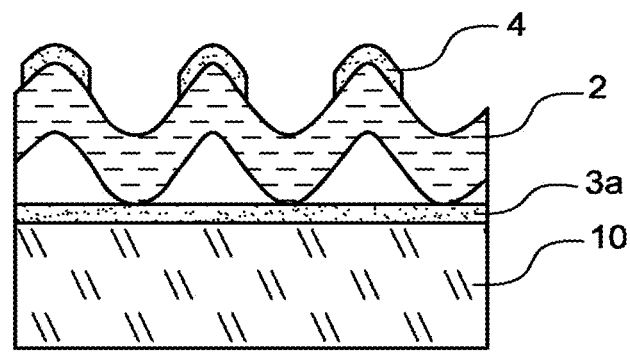

As represented in FIGS. 11 and 14, the piezoelectric layer 2 can also be an undulated layer suspended above the substrate 1 outside zones of localized contact with the lower electrode 3a which lies on the substrate. Such a structure can be obtained by a "solid manufacture" in which the piezoelectric layer 2, and possibly the metal layer 4 forming the upper electrode, form the skin, or are conformally deposited onto the foundation following the removal of the skin. Herein, this is the case where, by choosing the thickness of the foundation, the wrinkle formation is accompanied by a localized contact of the skin with the substrate (herein with the lower electrode 3a, possibly with several melting/solidification cycles of the foundation), and finally a removal of the foundation to suspend the undulated piezoelectric layer 2 above the substrate 1 is made. This removal can be facilitated because of the arrangement of the wrinkles. Thus, to facilitate the access of the etching solution, wrinkles arranged as parallel lines can be favoured and digging by etching at least one trench perpendicular to the wrinkles.

It has previously be seen that the substrate could be covered with the lower electrode. In one alternative illustrated in FIG. 10, the substrate 1 is covered with a lower intermediate layer 4 having surface undulations identical to those of the piezoelectric layer. The sensor is then manufactured in a similar way as that of FIG. 9, the lower electrode 3b being formed not at the surface of the substrate but interposed between the lower intermediate layer 4 and the piezoelectric layer 2.

Figure 12:
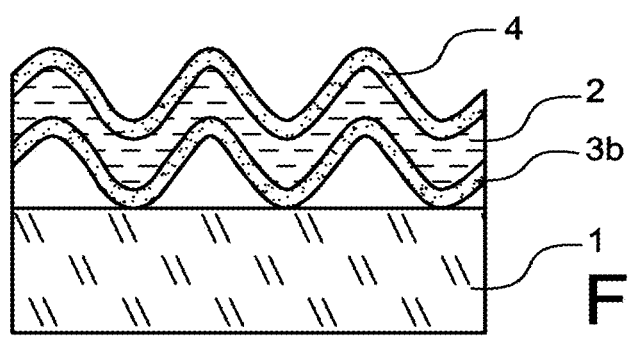

In another alternative represented in FIG. 12, the lower electrode 3b takes the form of an undulated layer suspended above the substrate 1 outside zones of localized contact with the substrate. The manufacturing method is similar to that of the sensor of FIG. 11 with the removal of the foundation within the scope of the "solid manufacture", the only difference being the presence of the lower electrode 3b at the surface of the foundation before its removal rather than at the surface of the substrate.

The sensors according to FIGS. 11, 12 and 14 with removal of the foundation are those which ensure a maximum deformability of the piezoelectric layer only because of the presence of air below the wrinkles, and hence a maximum accuracy.

Figure 13:
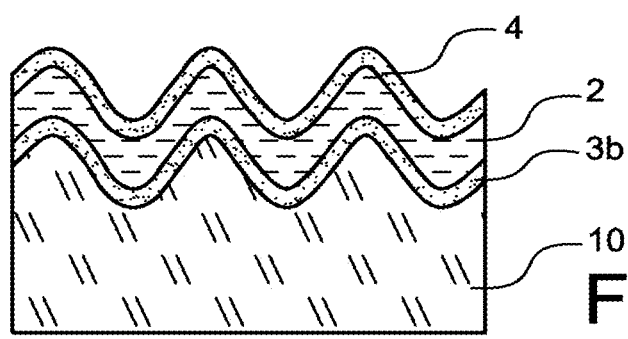

In another exemplary embodiment of the sensor according to the invention illustrated in FIG. 13, the substrate 10 has itself surface undulations identical to those of the piezoelectric layer 2.

Figure 10:
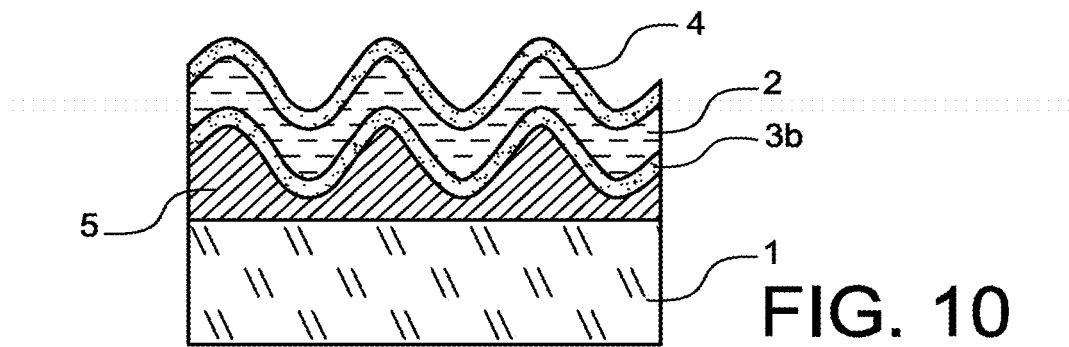

Within the scope of a "polymer manufacture", the sensor of FIG. 10 can be made by employing a substrate 10 of a polymeric material as a foundation, for example a Plexiglas (trade name) substrate, and a metal layer forming a lower electrode 2b as a skin. The lower electrode 3b can then be covered with the piezoelectric layer 2 and a metal layer that will act as an upper electrode 4. The skin can also form a bilayer associating the lower electrode 3b and the piezoelectric layer 2, or a trilayer by also associating thereto the metal layer forming the upper electrode 4.

Within the scope of a "solid manufacture", the sensor of FIG. 13 can be made using a superficial layer of the substrate as a foundation, and the lower electrode 3b (possibly with the piezoelectric layer 2, as well as possibly the upper electrode) as a skin. The skin can alternatively be removed after obtaining the wrinkled substrate, before depositing the lower electrode-piezoelectric layer-upper electrode stack.

In an exemplary embodiment not represented, the upper electrode layer 4 is not be directly formed at the surface of the piezoelectric layer 2, an upper intermediate layer being interposed between the upper electrode and the piezoelectric layer.

As represented in FIG. 14, the upper electrode can comprise a plurality of regions spatially separated from each other so as to enable several single detection zones to be formed. The sensor can then provide localization information, for example by integrating therein a matrix of detection zones. The metal layer forming the upper electrode can be etched accordingly, a mask covering the regions of the upper electrode to be preserved. A region of the upper electrode typically covers a plurality of wrinkles of the piezoelectric layer, and can cover the top of a single wrinkle as represented in FIG. 14.

The wrinkles of the piezoelectric layer can be oriented in a labyrinth, in a rectilinear manner, or even so as to form a series of concentric rings. In a possible embodiment, the piezoelectric layer has several distinct regions, the orientation of the wrinkles in a region being different from the orientation of the wrinkles in another region. By way of illustrating example, it can be conceived that wrinkles are rectilinearly oriented such that the wrinkles of a region are perpendicular to those of another region.

Alternatively, it can be contemplated to associate several unit sensors according to the invention, each unit sensor having a single type of orientation of the wrinkles, so as to provide a sensor consisting of several detection zones having different orientations. By way of illustrating example, it can be contemplated to have unit sensors with rectilinear orientation of the wrinkles, and to associate them so as to alternate detection zones the wrinkles of which are perpendicularly oriented between them from a detection zone to the other.

Figure 15:
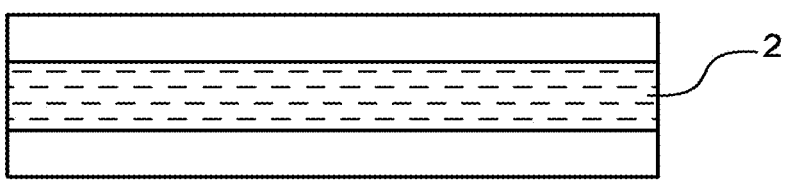
FIG. 15 presents three schemes of arrangement of the electrodes relative to the piezoelectric layer.
Figure 15:
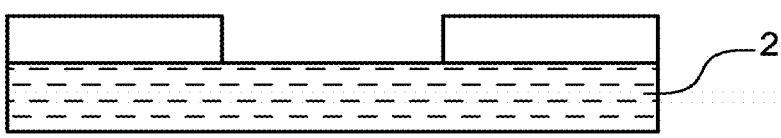
Figure 15:
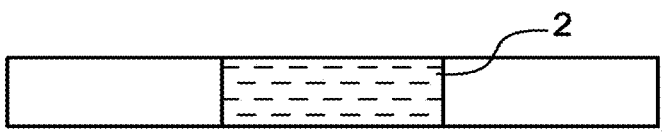

In the exemplary embodiments previously described, the piezoelectric layer and the electrodes are arranged so as to form a lower electrode-piezoelectric layer-upper electrode sandwich as a vertical stack. In reference to FIG. 15, the invention is however not restricted to such an arrangement (top of FIG. 15) but also extends to an arrangement according to which the electrodes are both arranged on the same side of the piezoelectric layer (for example both above the piezoelectric layer, in the middle in FIG. 15), or to an arrangement according to which the piezoelectric layer is laterally sandwiched by the electrodes (bottom of FIG. 15) by forming them on either side of the piezoelectric layer.

By virtue the invention, "wrinkled" structures can be obtained, the dimensions of which vary between a few $\mu m^2$ and a few $cm^2$. These structures can then be abutted in order to form structures having even more greater sizes.

It is also possible to implement the invention on non-planar (spherical, tubular . . . ) surfaces and thus to obtain sensors having a wide variety of geometries.

The invention claimed is:

1. A pressure-sensitive sensor, comprising:
    a substrate supporting a piezoelectric layer of a piezoelectric material,
    wherein the substrate is covered with a layer forming a lower electrode,
    wherein the piezoelectric layer includes surface undulations as wrinkles on which pressure is exerted upon use of the sensor, and
    wherein the piezoelectric layer is an undulated layer formed on the lower electrode and suspended above the substrate outside zones of localized adherent contact with the lower electrode.

2. The pressure-sensitive sensor according to claim 1, further comprising an upper electrode conformally formed at a surface of the piezoelectric layer.

3. The pressure-sensitive sensor according to claim 2, wherein the upper electrode comprises a plurality of regions spatially separated from each other.

4. The pressure-sensitive sensor according to claim 1, further comprising an upper electrode and an upper intermediate layer between the upper electrode and the piezoelectric layer.

5. The pressure-sensitive sensor according to claim 1, wherein the wrinkles of the piezoelectric layer are rectilinearly oriented.

6. The pressure-sensitive sensor according to claim 1, wherein the wrinkles of the piezoelectric layer are oriented to form a series of concentric rings.

7. A pressure-sensitive sensor comprising:
    a substrate supporting a piezoelectric layer of piezoelectric material,
    a lower electrode as an undulated layer suspended above the substrate outside zones of localized adherent contact with the substrate;
    wherein a piezoelectric layer includes surface undulations as wrinkles on which pressure is exerted upon use of the sensor; and
    wherein the piezoelectric layer is formed on the lower electrode.

8. The pressure-sensitive sensor according to claim 7, further comprising an upper electrode conformally formed at a surface of the piezoelectric layer.

9. The pressure-sensitive sensor according to claim 7, further comprising an upper electrode and an upper intermediate layer between the upper electrode and the piezoelectric layer.

10. The pressure-sensitive sensor according to claim 9, wherein the upper electrode comprises a plurality of regions spatially separated from each other.

11. The pressure-sensitive sensor according to claim 7, wherein the wrinkles of the piezoelectric layer are rectilinearly oriented.

* * * * *